United States Patent
Ohta et al.

(10) Patent No.: US 7,719,284 B2
(45) Date of Patent: May 18, 2010

(54) APPARATUS FOR MEASURING VOLTAGE

(75) Inventors: Takayuki Ohta, Tochigi (JP); Masanori Kawamoto, Tochigi (JP); Yuji Minoda, Saitama (JP); Toshiaki Ariyoshi, Saitama (JP); Yoshikazu Nomoto, Saitama (JP)

(73) Assignees: Keihin Corporation, Tokyo (JP); Honda Motor Co., Ltd., Tokyo (JP)

( * ) Notice: Subject to any disclaimer, the term of this patent is extended or adjusted under 35 U.S.C. 154(b) by 295 days.

(21) Appl. No.: 11/285,319

(22) Filed: Nov. 23, 2005

(65) Prior Publication Data

US 2006/0132139 A1    Jun. 22, 2006

(30) Foreign Application Priority Data

Nov. 30, 2004   (JP)   ............................. 2004-346959
Nov. 30, 2004   (JP)   ............................. 2004-347874

(51) Int. Cl.
    *G01N 27/416* (2006.01)
(52) U.S. Cl. .................. 324/434; 324/426; 320/116
(58) Field of Classification Search ............... 320/116; 324/426, 434
    See application file for complete search history.

(56) References Cited

U.S. PATENT DOCUMENTS 5,712,568 A * 1/1998 Flohr et al. ................. 324/434
6,639,408 B2 * 10/2003 Yudahira et al. ............ 324/434
6,639,409 B2 * 10/2003 Morimoto et al. ........... 324/434
6,677,758 B2 * 1/2004 Maki et al. .................. 324/429
6,803,766 B2 * 10/2004 Kobayashi et al. .......... 324/434
7,078,908 B2 * 7/2006 Fujita et al. ................. 324/433

FOREIGN PATENT DOCUMENTS

| JP | 11-237455   | 8/1999  |
| JP | 11-339828   | 12/1999 |
| JP | 2000-193694 | 7/2000  |
| JP | 2002-139522 | 5/2002  |
| JP | 2002-156392 | 5/2002  |
| JP | 2002-350472 | 12/2002 |
| JP | 2004-085208 | 3/2004  |

* cited by examiner

*Primary Examiner*—Edward Tso
*Assistant Examiner*—Ramy Ramadan
(74) *Attorney, Agent, or Firm*—Kratz, Quintos & Hanson, LLP

(57) ABSTRACT

An apparatus measures a voltage of a cell while scanning a group of cells in a cell stack, in which a plurality of cells is electrically connected in series. The apparatus has a first switching device and a voltage detecting device. The first switching device is connected in series with a signal line carrying a voltage of a cell. The voltage detecting device detects the voltage of the cell, which is electrically connected with signal lines carrying voltages of cells belonging to a group. When the first switching device is electrically connected with a connecting point between two successive groups of cells, the first switching device is shared by the two groups.

8 Claims, 6 Drawing Sheets

APPARATUS FOR MEASURING VOLTAGE

BACKGROUND OF THE INVENTION

The present invention relates to an apparatus for measuring voltage, and more particularly to an apparatus for measuring voltage of a cell while scanning a group of cells in a cell stack such as a fuel cell stack in which a plurality of cells is electrically connected in series.

A fuel cell is a type of battery which generates electromotive force by electrochemical reaction between hydrogen contained in a fuel gas as a main substance and oxygen. As a cell voltage of the fuel cell only reaches as high as 1 volt, some hundreds of cells are in general electrically connected in series to form a fuel cell stack, which provides a high voltage, 260 volts, for example. If power generation is continued while one cell generates an extremely low voltage, 0.5 volts for example, it may result in damage of the fuel cell stack due to a drop in its aggregate output voltage, which is caused by corrosion occurring in the failed cell. It is typical that measurement and monitoring of a voltage of cell is carried out during operation of a fuel cell stack by scanning cells one by one or a group of cells group by group. In this way, continuous measurement and monitoring of a cell voltage provides prompt notification of occurrence of an abnormal cell, because when a cell or a plurality of cells suffers damage, there is a remarkable drop in voltage. Accordingly, it is possible to immediately stop operation of the fuel cell stack so as to prevent development of damage which results from delay in sensing an occurrence of abnormal operation.

An example of measurement of voltage for an individual cell is disclosed in patent document 1, which uses a terminal shaped like a projection provided for a separator between successive cells. Because a hole is no more required of an end surface of the separator by introduction of the terminal, a socket of a lead wire can be connected with the terminal even if the separator gets thinner. Accordingly, it is possible to measure a voltage for the individual cell even if a fuel cell decreases in dimension.

Various techniques associated with measurement of cell voltage for a fuel cell have been reported. FIG. 5 is a diagram showing a conventional apparatus for measuring voltage. As shown in FIG. 5, a voltage of an individual cell is measured and monitored in the following manner. Cells contained in a fuel cell are divided into a plurality of groups. For example, when switches S31, S32, S33 and S34 belonging to a first group are simultaneously turned on, individual voltages of cells C31, C32 and C33 belonging to the first group are detected by differential amplifiers D31, D32 and D33 of a detecting circuit 30. The voltages are sent to an A/D converter of a central processing unit (CPU) (not shown), where measurement and monitoring are carried out. Subsequently, when the switches S31, S32, S33 and S34 of the first group are simultaneously turned off and switches S35, S36, S37 and S38 belonging to a second group are simultaneously turned on, individual voltages of cells C34, C35 and C36 belonging to the second group are detected by the differential amplifiers D31, D32 and D33, and measured and monitored by the CPU. In this way, it is possible to measure a voltage of each cell in the fuel cell by scanning groups one by one while switches of the groups are turned on and off one after another.

FIG. 6 is a diagram illustrating a polarity of measured voltage for each cell in the detecting circuit shown in FIG. 5. When groups of cells are scanned group by group as described above, voltages imposed on the differential amplifiers D31, D32 and D33 have a constant polarity irrespective of groups. This will allow use of a single power supply, which for example is a one-way power supply having a ground and a positive power source, for each of the differential amplifiers D31, D32 and D33. In this way, the differential amplifiers D31, D32 and D33 can be simply configured. In this connection, filters F31, F32 and F33 disposed in the detecting circuit 30 are elements for removing noise. Buffers B31, B32 and B33 are elements for shaping a wave form of detected voltage.

A technique related to an apparatus for measuring voltage using a flying capacitor is disclosed in patent document 2. The technique is applied to a fuel cell stack in which many cells are electrically connected in series. A capacitor is connected in parallel with each of the cells, and a group is arranged so as to include five cells, for example. Measurement of voltage is carried out by detecting a voltage imposed on a capacitor corresponding to a cell while a switch corresponding to this cell is turned on. By repeating this measurement with switching, it is possible to measure voltages for all the cells of the group. The measurement is carried out for groups one after another so as to complete measurement for all the cells in the fuel cell stack. This technique results in a simplified configuration of circuit. In addition, a technique is disclosed in patent document 3, which measures voltages of individual cells one by one using a plurality of switches in a fuel cell stack, in which a plurality of cells is electrically connected to each other in series. This technique brings about measurement of a voltage of an individual cell with high precision, which does not require a complicated setup.

Patent document 1: Japanese Published Patent Application 11-339828

Patent document 2: Japanese Published Patent Application 2002-156392 (paragraphs 0051-0058, and FIG. 1)

Patent document 3: Japanese Published Patent Application 11-237455 (paragraphs 0018- 0024, FIG. 1 and FIG. 2)

Because a large number of cells are electrically connected to each other in series, the detecting circuit shown in FIG. 5 requires more pieces of switches than number of cells so as to measure a voltage for an individual cell. Specifically speaking, a cell lying in an interface between two successive groups requires two pieces of switches so as to turn off one signal line of a previous group and to turn on the other line of a next group. For example, the cell C34 lying in one interface between a first group and a second group requires the switches S34 and S35. Similarly, the cell C36 lying in the other interface of the second group and a third group requires the switches S38 and S39. It is deduced that switches more than 181 pieces, namely 181+180÷3−1=240 pieces, are necessary in case of a fuel cell stack having 180 cells electrically connected to each other in series, when a group is arranged so as to include three cells. Because PhotoMOS relays having high withstand voltage are in general selected for these switches, the more the number of switches increases, the more expensive material cost will be. In this connection, it may be possible to anticipate some decrease in total number of switches if number of cells belonging to a group is increased. The reason for this is that number of switches decreases, which lie in an interface between successive groups. However, an increase in the number of cells belonging to a group induces an increase in number of filters, buffers and differential amplifiers in a detecting circuit 30, resulting in an increase in material cost of an apparatus for measuring voltage as a whole.

Although the apparatus for detecting voltage disclosed in patent document 2 simplifies a setup of a circuit made of switches, it additionally requires a capacitor on which a voltage of a cell is imposed, resulting in a cost increase. In addition, the circuit for detecting voltage for a cell stack disclosed in patent document 3 has a drawback that a setup of circuit for switching devices turns complex.

SUMMARY OF THE INVENTION

In view of the drawbacks described above, the present invention seeks to provide an apparatus for measuring voltage, which is able to provide efficient measurement with a simple setup of circuit due to a decrease in the number of switches, in carrying out simultaneous measurement of voltage for a plurality of cells.

It is an aspect of the present invention to provide an apparatus for measuring a voltage of a cell while scanning a group of cells in a cell stack in which a plurality of cells is electrically connected in series. The apparatus comprises a first switching device and a voltage detecting device. The first switching device is connected in series with a signal line carrying a voltage of a cell. The voltage detecting device detects the voltage of the cell, which is electrically connected with signal lines carrying voltages of cells belonging to a group. When the first switching device is electrically connected with a connecting point between two successive groups of cells, the first switching device is shared by the two groups.

It is another aspect of the present invention to provide an apparatus, which further comprises a second switching device. The second switching device selects a line to be grounded from two signal lines, which carry voltages of cells lying in interfaces on both sides of the group of cells. Every time one of the two signal lines is grounded by switching provided by the second switching device, the voltage detecting device detects a voltage of a cell in a constant polarity.

The apparatus described above is able to decrease total number of switching devices to a minimum. Introduction of sharing of a switching device causes reversal of polarity, between a positive and a negative polarity, when measurement is transferred from a group to an adjacent group. The apparatus according to the present invention, which switches signal lines so as to connect to the ground for a group of cells to be measured, provides a constant polarity of a cell voltage to the voltage detecting device. In this way, it is possible to operate the voltage detecting device by use of a single power supply.

As a result, a device which can be operated by a single power supply, such as a differential amplifier, for the voltage detecting device, which contributes to a large amount of decrease in material costs of an apparatus for measuring voltage. As signal lines lying both ends of a group of cells are alternately switched so as to be connected to the ground each time a polarity of the group reverses, number of cells which can be scanned at one time will be doubled. Because scanning is carried out more rapidly for multi channels, it is possible to measure voltage for cells more rapidly, which are electrically connected to each other in series to form a group.

DESCRIPTION OF THE PREFERRED EMBODIMENTS

Description is given of an embodiment of an apparatus for measuring voltage according to the present invention with reference to drawings. Measurement of cell voltage for a fuel cell, in which a large number of cells are electrically connected to each other in series, will be efficiently carried out in the following manner. The cells are divided into groups, each of which is arranged so as to include certain plural number of cells. Measurement is simultaneously carried out for individual cells belonging to a group. Another measurement is carried out by scanning a subsequent group of cells. Scanning groups one by one can be carried out by simultaneously turning on or off switches belonging to a group, each of which is provided for an input terminal (signal line) of each cell for measuring voltage. Separate switches are not provided for a signal line lying in an interface between two successive groups, but a common switch is shared by the groups. In other words, although scanning is transferred from one group to a subsequent group, the common switch is left turned on.

Description is given of the embodiment of the present invention below, taking into account the setup described above which helps reduce required number of switches.

Before describing an apparatus for measuring voltage according to the present invention, description is first given of a circuit which plays a background role in the invention.

Figure 1:
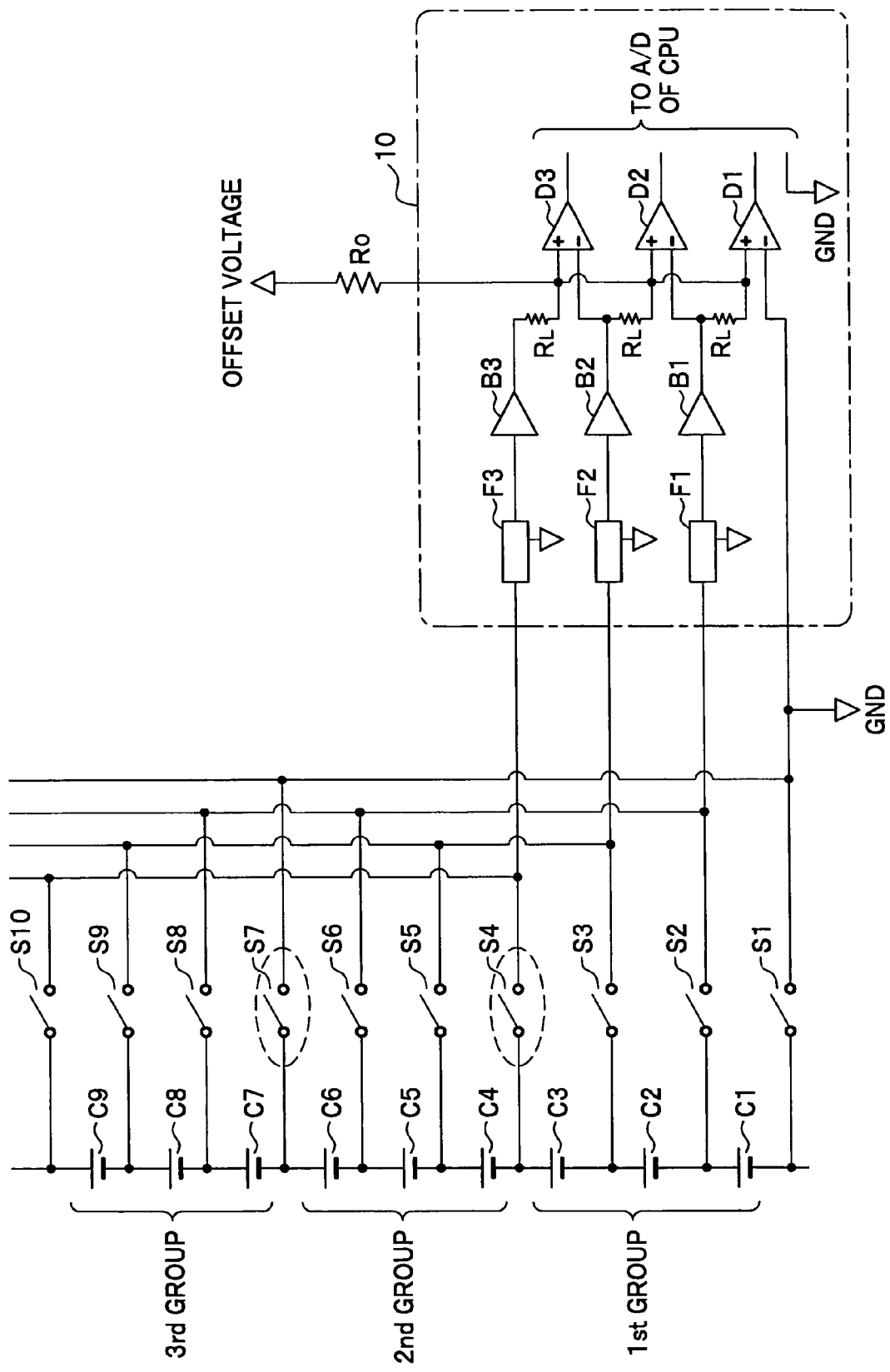
FIG. 1 is a circuit diagram showing a main portion of an apparatus for measuring voltage, which introduces sharing of a switch which lies in an interface between successive groups.

Description is given of an example as shown in FIG. 1, in which measurement is carried out for a voltage of an individual cell while scanning is made for groups one by one, which is arranged so as to include three cells for convenience sake. The example does not limit the number of cells belonging to a group to three, but it may be alternatively possible to select larger number of cells for a group. It is natural that increasing the number of cells in a group should result in a decrease in time required for completing measurement for all the cells.

As shown in FIG. 1, in a detecting circuit 10 (voltage detecting device), cells C1 to C9 are connected to each other in series, which occupy a portion of a fuel cell in which a large number of cells are connected to each other in series. These cells C1 to C9 are divided into groups: a first group of C1, C2 and C3, a second group of C4, C5 and C6, and a third group of C7, C8 and C9. While scanning is made for these groups one by one, measurement is simultaneously carried out for cells belonging to a group. Switches (switching devices) S1 to S10 are connected with signal lines, which serve as terminals for measurement of voltage for the cells C1 to C9, respectively. The switch C4 shared by the two groups is provided for a signal line lying in an interface between the last cell C3 of the first group and the first cell C4 of the second group. Similarly, the shared switch C7 is provided for a signal line lying in an interface between the last cell C6 of the second group and the first cell C7 of the third group. A signal line of negative polarity of the first cell C1 belonging to the first group is connected to the ground GND. In this connection, it may be possible to adopt FotoMOS relays, which can withstand a maximum voltage resulting from cells connected in series in a fuel cell, 260 volts in case of 200 cells for example, for the switches S1 to S10.

Signal lines for respective groups are connected with the detecting circuit 10. The detecting circuit 10 includes filters F1, F2 and F3, buffers B1, B2 and B3, differential amplifiers D1, D2 and D3 and a resister $R_o$. The filters F1 to F3 remove noise which occurs during turning on and off of the switches S1 to S3, or noise induced by the signal lines. The buffers B1 to B3, which are connected with the filters F1 to F3 respectively, shape unevenness occurring in rising and falling waveforms. The differential amplifiers D1 to D3, which receive negative and positive voltages from the cells C1 to C9 so as to detect their voltages, sending the detected voltages to the A/D converter of the CPU (not shown). The resister Ro adjusts an offset voltage for each of the differential amplifiers D1 to D3. In addition, there is a resister $R_L$ between an output of each of the buffers B1 to B3 and a positive input terminal of each of the differential amplifiers D1 to D3, so that a signal level of the positive input terminal is adjusted.

Description is given of measurement of voltage for the cells C1 to C9 with the detecting circuit 10 shown in FIG. 1. When the switches S1 to S4 are simultaneously turned on, voltages of the cells C1 to C3 belonging to the first group are simultaneously measured. More specifically speaking, a potential of a negative polarity of the cell C1, which is connected to the ground GND, enters a negative input terminal of the differential amplifier D1. On the other hand, a potential of a positive polarity of the cell C1 enters a positive input terminal of the differential amplifier D1 via the filter F1 and the buffer B1. In this way, a voltage of the cell C1, which is a difference in potential between the positive and negative polarities of the cell C1, is generated, so that a signal indicative of the voltage of the cell C1 comes out from an output terminal of the differential amplifier D1.

Similarly, a potential of a negative polarity of the cell C2 enters a negative input terminal of the differential amplifier D2 via the filter F1 and the buffer B1. On the other hand, a potential of a positive polarity of the cell C2 enters a positive input terminal of the differential amplifier D2 via the filter F2 and the buffer B2. In this way, a voltage of the cell C2, which is a difference in potential between the positive and negative polarities of the cell C2, is generated, so that a signal indicative of the voltage of the cell C2 comes out from an output terminal of the differential amplifier D2.

In the same manner as described above, a signal indicative of a voltage of the cell C3 comes out from an output terminal of the differential amplifier D3. The voltages, which the differential amplifiers D1 to D3 have simultaneously measured for the cells C1 to C3 belonging to the group 1, are sent to the CPU (not shown). Following combination of cells with differential amplifiers is called forward measurement: the cell C1 is assigned to the differential amplifier D1, the cell C2 to the differential amplifier D2 and the cell C3 to the differential amplifier D3, which are hereinafter referred to as C1 →D1, C2→D2 and C3→D3, respectively.

When the measurement for the cells C1 to C3 is completed and another measurement for the cells C4 to C6 is started, the switches S5 to S7 are simultaneously turned on after the switches S1 to S3 have been simultaneously turned off, leaving the switch S4 turned on. It should be noted that the shared switch S4 connected with a common signal line for the last cell C3 of the first group and the first cell C4 of the second group is left turned on. Under switching operation described above, the cells belonging to the second group are measured in the following way: the cell C4 is measured by the differential amplifier D3, the cell C5 by the differential amplifier D2 and the cell C6 by the differential amplifier D1. In this measurement of the second group, combination of cells with differential amplifiers is reversed in comparison with the first group. This combination, C4→D3, C5→D2 and C6 →D1, is hereinafter referred to as backward measurement.

More detail description is given of measurement of voltage for the cells C4 to C6 of the second group. When the measurement for the cells C1 to C3 is completed, the switches S5 to S7 are simultaneously turned on after the switches S1 to S3 have been simultaneously turned off, leaving the switch S4 turned on. In this way, another measurement for the cells C4 to C6 is initiated. A potential of a negative polarity of the cell C4 enters the positive input terminal of the differential amplifier D3 via the filter F3 and the buffer B3. On the other hand, a potential of a positive polarity of the cell C4 enters the negative input terminal of the differential amplifier D3 via the filter F2 and the buffer B2. In this way, a voltage of the cell C4, which is a difference in potential between the positive and negative polarities of the cell C4, is generated, so that a signal indicative of the voltage of the cell C4 comes out from the output terminal of the differential amplifier D3.

Similarly, a potential of a negative polarity of the cell C5 enters the positive input terminal of the differential amplifier D2 via the filter F2 and the buffer B2. On the other hand, a potential of a positive polarity of the cell C5 enters the negative input terminal of the differential amplifier D2 via the filter F1 and the buffer B1. In this way, a voltage of the cell C5, which is a difference in potential between the positive and negative polarities of the cell C5, is generated, so that a signal indicative of the voltage of the cell C5 comes out from the output terminal of the differential amplifier D2.

A potential of a negative polarity of the cell C6 enters the positive input terminal of the differential amplifier D1 via the filter F1 and the buffer B1. On the other hand, a potential of a positive polarity of the cell C6, which is connected to the ground GND, enters the negative input terminal of the differential amplifier D1. In this way, a voltage of the cell C6, which is a difference in potential between the positive and negative polarities of the cell C6, is generated, so that a signal indicative of the voltage of the cell C6 comes out from the output terminal of the differential amplifier D1.

The voltages, which the differential amplifiers D1 to D3 have simultaneously measured for the cells C4 to C6 belonging to the second group, are sent to the CPU (not shown). In measurement of the second group, backward measurement is carried out, in which the cells and differential amplifiers are combined as follows: C4→D3, C5→D2 and C6→D1.

When the measurement for the cells C4 to C6 is completed, the switches S8 to S10 are simultaneously turned on after the switches S4 to S6 have been simultaneously turned off, leaving the switch S7 turned on. In this way, another measurement for the cells C7 to C9 is initiated. In measurement of the third group, forward measurement in the same manner as that of the first group is carried out, in which the cells and differential amplifiers are combined as follows: C7→D1, C8→D2 and C9→D3. The voltages, which the differential amplifiers D1 to D3 have simultaneously measured for the cells C7 to C9 belonging to the third group, are sent to the CPU (not shown).

Figure 5:
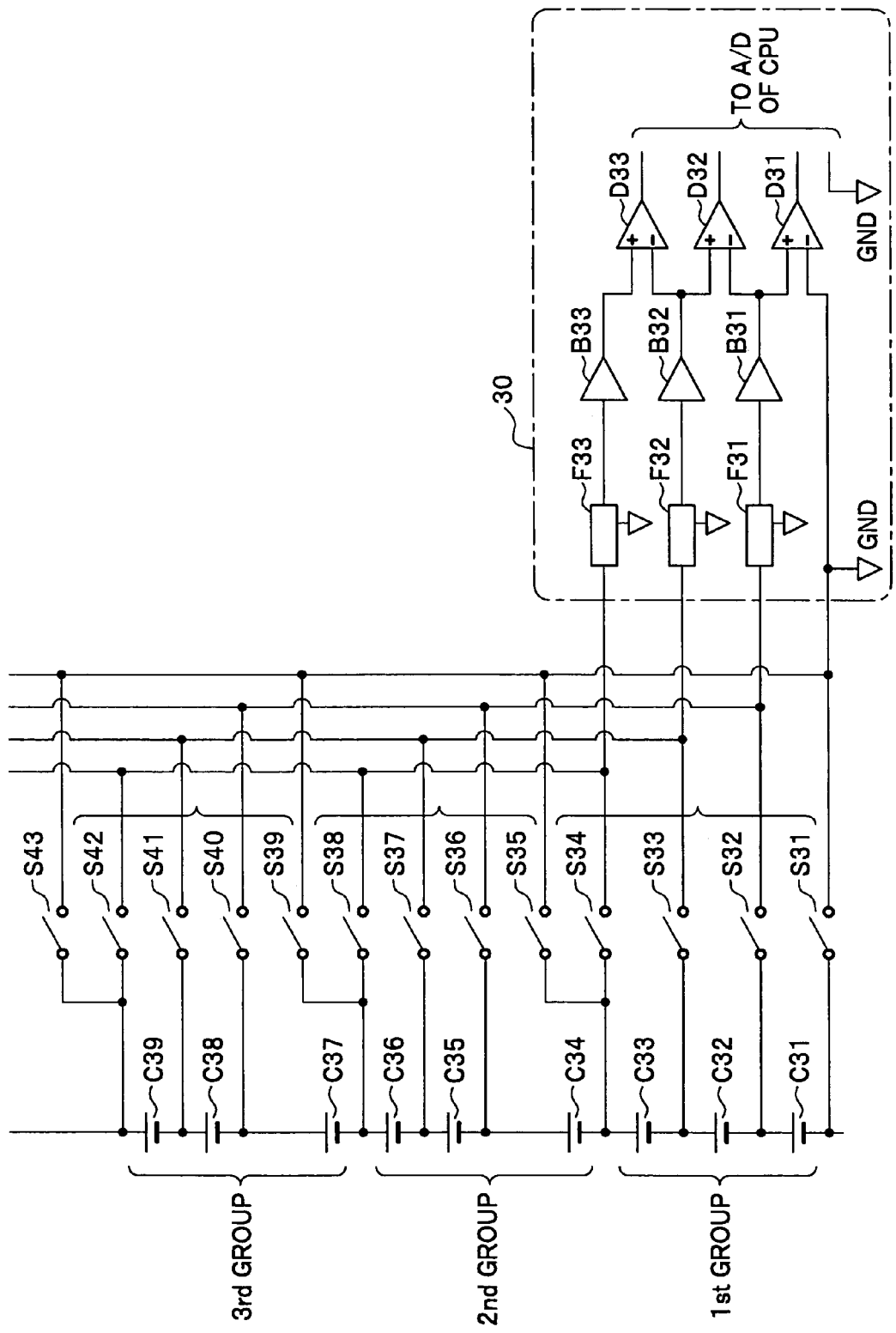
FIG. 5 is a diagram showing a conventional apparatus for measuring voltage.
Figure 6:
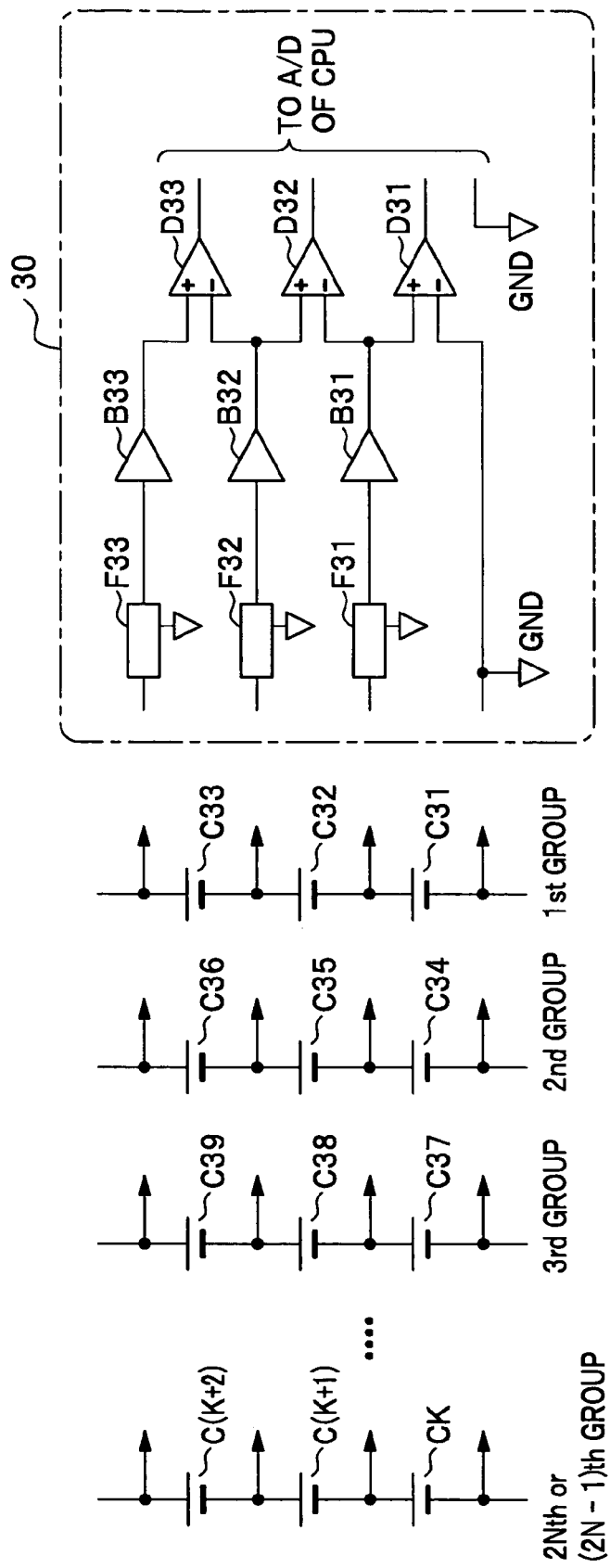
FIG. 6 is a diagram illustrating a polarity of measured voltage for each cell in the detecting circuit shown in FIG. 5.

The apparatus for measuring voltage according to the present invention described above, which introduces sharing of a switch lying in an interface of successive groups, allows small number of switches in comparison with a conventional apparatus shown in FIG. 5. Suppose 180 cells are electrically connected to each other in series and a group is arranged so as to include 3 cells. In this case, the conventional apparatus requires 240 pieces of switches. In contrast, the apparatus for measuring voltage according to the present invention shown in FIG. 1 is able to reduce the number of switches to 181 pieces, which means it is possible to reduce by 59 pieces in comparison with the conventional apparatus. To put it differently, this reduction is comparable to number of groups.

If a voltage imposed on the A/D converter of the CPU falls negative, to which output signals (detected voltages) of the differential amplifiers D1 to D3 are sent, in measurement carried out by the detecting circuit 10 shown in FIG. 1, stricter requirements are requested to apply to the A/D converter. It is possible to cope with the difficulty by introducing selection of offset voltage. Suppose electromotive force of a cell ranges zero to 1.3 volts, for example, as is typically the case with a fuel cell. If an offset voltage of +1 volt for forward measurement and an offset voltage of +5 volts for backward measurement are selected for the detecting circuit 10 shown in FIG. 1, voltages imposed on the A/D converter fall within a range of +1 to +5 volts, which relaxes requirements applied to the A/D converter.

Figure 2:
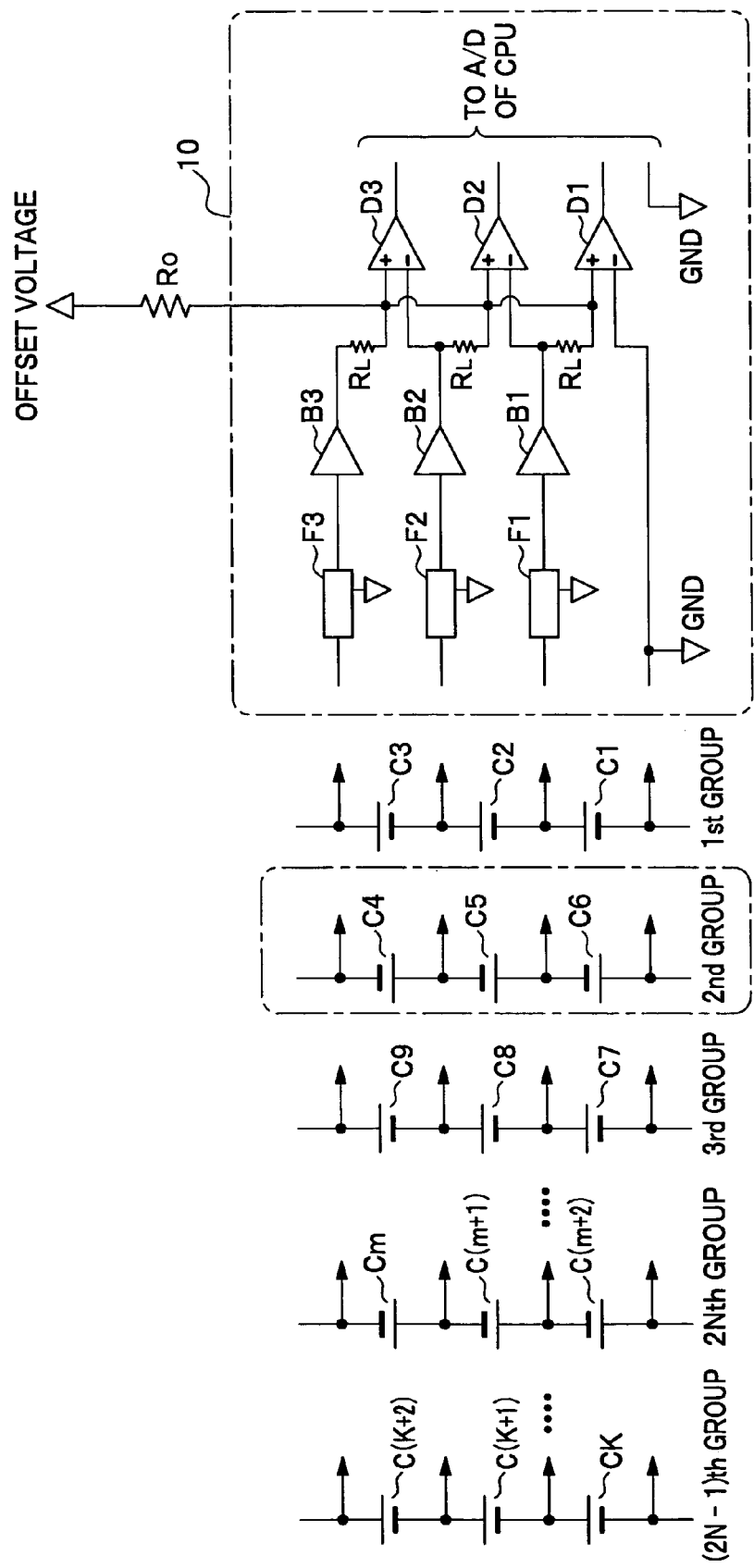
FIG. 2 is a schematic diagram illustrating a polarity of detected voltage of a cell in the detecting circuit shown in FIG. 1.

Next, description is given of a polarity of voltage of a cell, which is imposed group by group on the differential amplifiers D1 to D3. When measurement is carried out one after another by turning on and off switches in the apparatus for measuring voltage shown in FIG. 1, detected voltages of cells enter group by group the differential amplifiers D1 to D3 with polarities as shown in FIG. 2. It is known from FIG. 2 that in an oddly numbered group, the first group for example, voltages of cells (C1 to C3) are forwardly imposed on the differential amplifiers D1 to D3 while a negative pole of the cell C1 with the lowest potential is connected to the ground GND. In contrast, in an evenly numbered group, the second group for example, voltages of cells (C4 to C6) are backwardly imposed on the differential amplifiers D1 to D3 while a positive pole of the cell C6 with the highest potential is connected to the ground GND.

As shown in FIG. 2, a polarity of voltage imposed on the differential amplifiers D1 to D3 in measurement of an oddly numbered group is opposite to that in an evenly numbered group. Accordingly, it is necessary to provide a source voltage, which is imposed on the respective differential amplifiers D1 to D3, so that its polarities are opposite to each other between the oddly and evenly numbered groups at measurement. For example, the differential amplifiers D1 to D3 require a power source of zero to plus 5 volts in measurement of an oddly numbered group, but they require a power source of minus 5 to zero volts in measurement of an evenly numbered group. The differential amplifiers D1 to D3 require a power source having both positive and negative polarities (bipolar power source) so as to carry out measurement for all the cells in a fuel cell. This results not only in complication of power source circuit (not shown) in the detecting circuit 10 shown in FIG. 1, but also in necessity of differential amplifiers compatible with a bipolar power source, which are more expensive than those compatible with a single power source.

Furthermore, because a power source voltage for the differential amplifiers D1 to D3 is defined in their specification, number of channels (number of cells) at one scanning is automatically determined so as to satisfy the power source voltage in the detecting circuit shown in FIG. 1. Suppose a maximum rated voltage for the differential amplifiers D1 to D3 is 20 volts and a cell voltage of 3 volts for a pair of cells. In this case, number of cells which can be measured at a time of scanning turns out to be three cells (20V÷2÷3V≅3). Because the number of cells which can be scanned is not freely selected but restricted to be not more than three, it may not be possible to increase number of cells belonging to a group so as to shorten time required for measurement. When a signal line shared by successive groups in the apparatus for measuring voltage shown in FIG. 1, which is connected to the ground, fails due to a malfunction, disconnection for example, a problem shows up. If a signal line for the switch S4 shared by the first and second groups fails due to disconnection, for example, it will end up with losing measurement of voltage for the cells C1 to C3 of the first group and the cells C4 to C6 of the second group.

The apparatus for measuring voltage according to the present invention not only allows a reduction in the number of switches as shown in FIG. 1, but also introduces a switch, which provides switching for selection of a signal line to be connected to the ground GND. The switch carries out the switching so that a signal carrying a negative voltage of a cell, which enters a differential amplifier as a measurement reference for the detecting circuit 10, is arranged so as to be a reference potential (ground potential) irrespective of groups to be scanned. Because the differential amplifier detects a constant polarity of cell voltage in measurement of any group, it is possible to adopt a differential amplifier compatible with a single power source. Therefore, it is possible to achieve a further decrease in cost for the apparatus for measuring voltage as a whole. Also the introduction of the switch prevents losing measurement of voltage for all the cells belonging to the two groups at a failure due to disconnection of a signal line shared by the groups, thereby minimizing the failure.

Figure 3:
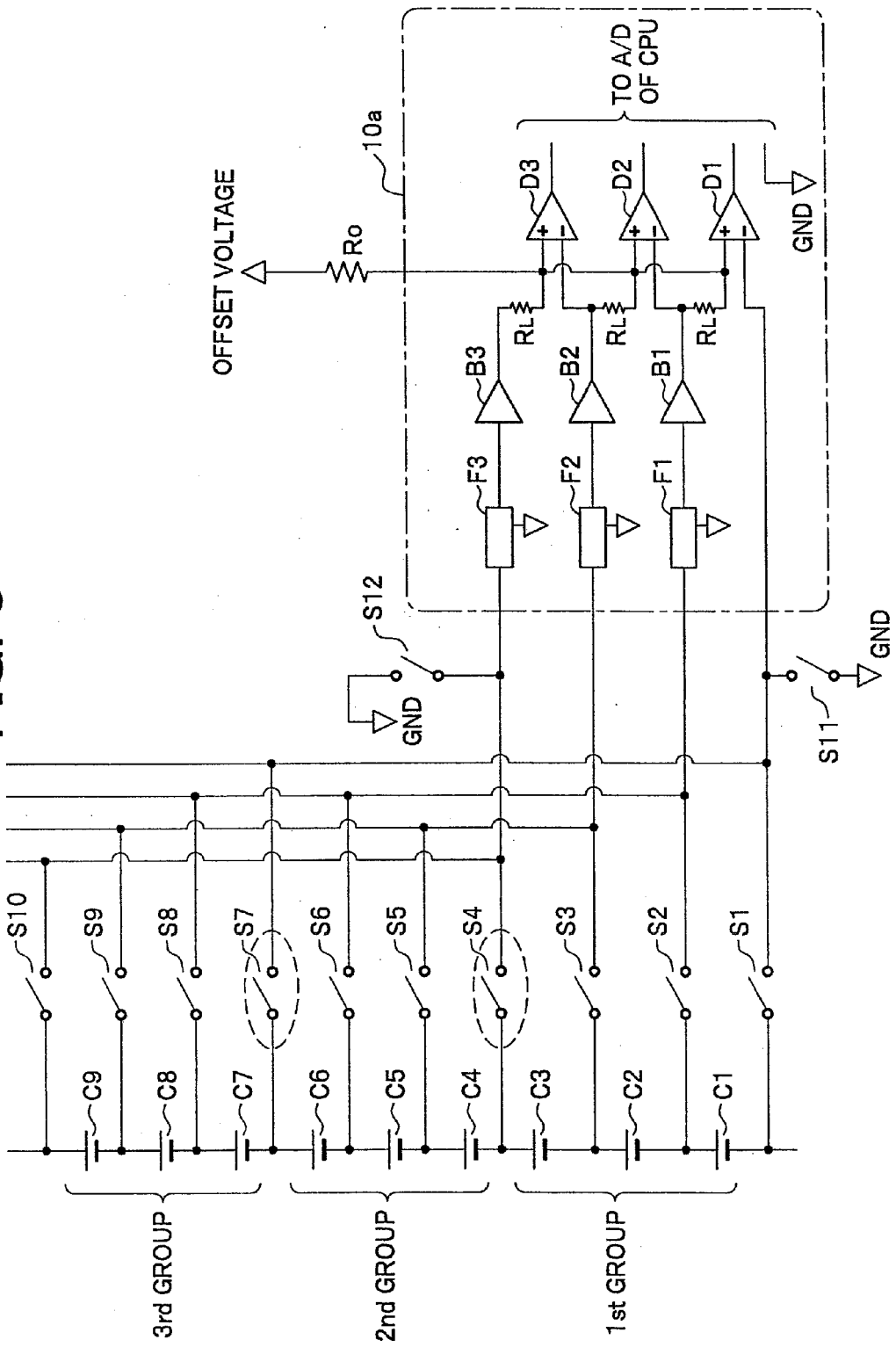
FIG. 3 is a circuit diagram showing an apparatus for measuring voltages according to the present invention.

Switches S11 and S12 (switching devices), which are for selecting a signal line to be connected to the ground GND, are added to a detecting circuit (voltage detecting device) 10a shown in FIG. 3 in comparison with the detecting circuit shown in FIG. 1. Description is not repeated for other elements which are the same as those shown in FIG. 1. In this connection, it may be alternatively possible to adopt Foto-MOS relays, which can withstand a maximum voltage resulting from cells connected in series in a fuel cell, 260 volts in case of 200 cells for example, for the switches S11 and S12 like the switches S1 to S10.

As shown in FIG. 3, two lines are added. One line connects a signal line (signal line of a negative pole of the cell C1 belonging to the first group), which enters a negative input terminal of the differential amplifier D1, to the ground GND via the switch S11. The other line connects a signal line (signal line shared by a positive pole of the cell C3 belonging to the first group and a negative pole of the cell C4 belonging to the second group), which enters a positive input terminal of the differential amplifier D3, to the ground GND via the switch S12.

In a setup of circuit described above, the switches 11 and 12 are alternately turned on and off each time measurement is transferred from one group to another so that one of the two signal lines described above is alternately connected to the ground GND. In other words, a reference potential (ground potential) of a cell voltage is alternately connected with one of the negative input terminal of the differential amplifier D1 and the positive input terminal of the differential amplifier D3 according to a group to be measured.

Detailed description is further given as follows. Although order of cell voltages entering the differential amplifiers D1 to D3 vary between the forward and backward measurement, a negative potential of a differential amplifier serving as a reference is always connected to the ground GND by switching. The forward measurement represents connection between cells and differential amplifiers as follows: C1→D1, C2→D2 and C3→D3. On the other hand, the backward measurement as follows: C4→D3, C5→D2 and C6 →D1. Because the ground GND of the differential amplifiers D1 to D3 is arranged depending on forward or backward measurement, it is possible to adopt a single power source, in which a single sign of potential is provided with respect to a reference potential (ground potential), as a power supply for the differential amplifiers D1 to D3.

Further detailed description is given of the detecting circuit 10a shown in FIG. 3. When measurement is carried out for the cells C1 to C3 of the first group, the switch S11 as well as the switches S1 to S4 are turned on. In this way, forward measurement is carried out, in which combination of the cells and the differential amplifiers are as follows: C1→D1, C2→D2 and C3→D3. Because a ground potential (reference potential) is allocated to the negative input terminal of the differential amplifiers D1 by the switch S11, all the differential amplifiers D1 to D3 are able to work with a single power source.

When the measurement of the cells C1 to C3 has been completed and another measurement of the cells C4 to C6 of the second group is initiated, the switch 11 is turned off and the switch 12 is turned on first. This operation provides switching that allocates the ground potential (reference potential) to a signal line connected with the positive terminal of the differential amplifier D3. Subsequently, the switches S5 to S7 are simultaneously turned on after the switches S1 to S3 have been simultaneously turned off, leaving the switch S4 turned on, so that measurement of the cells of the second group is initiated.

Because the ground potential is allocated to the positive terminal of the differential amplifier D3 in the measurement described above, in which the backward measurement, C4→D3, C5→D2 and C6→D1, is carried out, all the differential amplifiers D1 to D3 are able to work with a single power source. In this way, even if a polarity of signal of a cell voltage varies depending on a group of cells to be measured, the differential amplifiers D1 to D3 are able to operate with a single power source, because they work in unison in a direction of one of positive and negative potentials with respect to a certain reference potential.

Figure 4:
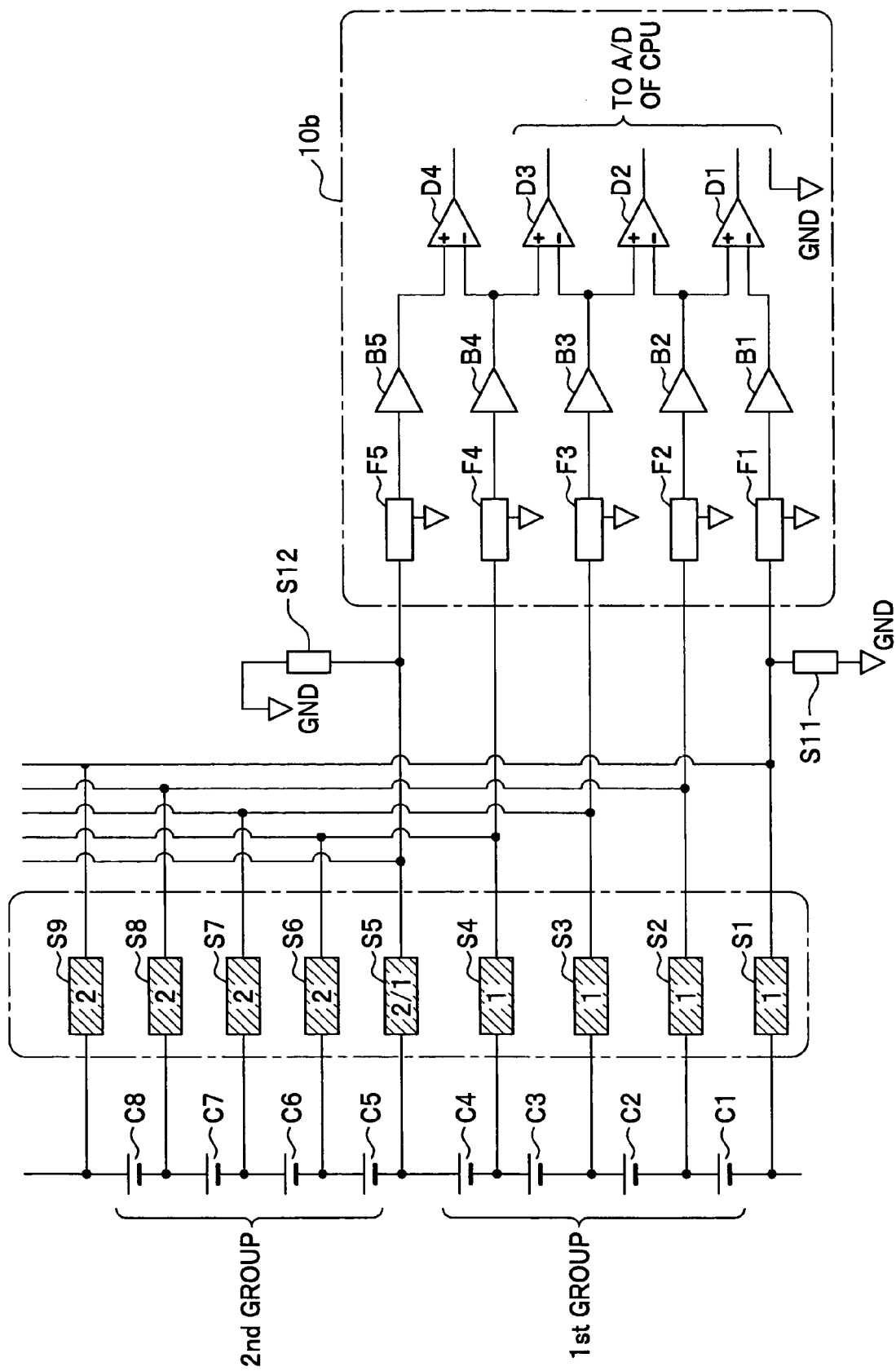
FIG. 4 is a circuit diagram showing an example of an apparatus for measuring voltage according to the present invention, assuming that a group includes four cells.

FIG. 4 is a circuit diagram showing an example of an apparatus for measuring voltage according to the present invention, assuming that a group includes four cells. In a detecting circuit (voltage detecting device) 10b shown in FIG. 4A, a PhotoMOS relay, which withstands a total voltage of all the cells in a fuel cell, is used for each of the switches S1 to S9 for measurement of cell voltage and the switches S11 and S12 for switching a grounding line.

As shown in FIG. 4, measurement of cell voltage is carried out for four cells at a time for each group. Because a common switch (PhotoMOS relay) S5 is connected with a signal line shared by the first and second groups, it may be possible to reduce the PhotoMOS relays by the number comparable to that of the groups of cells in a fuel cell in comparison with a conventional apparatus for measuring voltage. In this case, a polarity of a signal carrying a cell voltage, which is received by differential amplifiers D1 to D4, reverses each time a group of cells to be measured is transferred from one to another. More specifically speaking, a signal of cell voltage received by the differential amplifiers D1 to D4 reverses between positive and negative potentials each time measurement is transferred from an oddly numbered group to an evenly numbered group, and vice versa.

It may be necessary for the differential amplifiers D1 to D4 to have a bipolar power supply so as to accommodate the reversal of polarity. However, in a setup of circuit shown in FIG. 4, a first signal line of a group of cells is connected to the ground GND by alternately turning on one of the switches S11 and S12 each time measurement is transferred from one group to another.

As shown in FIG. 4, the switch S11 is provided in a negative signal line of the cell C1 of the first group so as to connect this line to the ground GND. Similarly the switch S12 is provided in a negative signal line of the cell C5 of the second group so as to connect this line to the ground GND. The switches S11 and S12 are alternately turned on and off according to an odd or evenly numbered group: turning on the switch S11 during measurement of the first group and turning on the switch S12 during measurement of the second group, for example. In this way, although a polarity of a signal of cell voltage received by the differential amplifiers D1 to D4 reverses for each switching of groups, a ground potential (reference potential) is controlled so as to enter a reference terminal of a differential amplifier.

Alternate switching of the ground GND using the switches S11 and S12 as described above, which reverses a reference potential (ground potential) of a cell voltage between negative and positive potentials, allows use of a single power source which supplies power to the differential amplifiers D1 to D4. In this way, the differential amplifiers D1 to D4 do not require a bipolar power source, but sufficiently work with a single power source.

As a result, it may be possible to double number of cells which can be scanned at a time in comparison with an apparatus without switching of the ground. Suppose a maximum rated voltage for a differential amplifier is 20 volts and a cell voltage of 3 volts for a pair of cells in this case, as shown in FIG. 1. The number of cells which can be scanned at a time is three cells (20V÷2÷3V≅3). Because a bipolar power source is required for the differential amplifier, the number of cells is limited to three.

In contrast, when switching of the ground is carried out as shown in FIG. 3, for example, and the same conditions described above are assumed, number of cells which can be scanned at a time is six (20V÷3V≅6). Because the number of cells turns out to be two times that of measurement without switching the ground, it may be possible to measure voltages of cells of a fuel cell by higher-speed scanning.

When a signal line of the switch S5 fails due to disconnection in case of an apparatus without switching of the ground, it may fall into losing measurement for eight cells, the cells C1 to C4 of the first group and the cells C5 to C8 of the second group. In contrast, an apparatus for measuring voltage, which introduces switching of the ground by the switches S11 and S12, may restrict failure of measurement to only four cells, C5 to C8. As described above, introduction of switching of the ground can decrease the number of cells by half, which can not be measured when disconnection of a signal line occurs.

The apparatus for measuring voltage according to the present invention described above, which reverses a polarity of voltage of a cell according to a group to be measured, allows shared use of a switch, thereby contributing to a reduction in the number of parts. In addition, because a constant polarity of cell voltage can be detected by switching a signal line, which is connected to the ground GND, when a polarity of cell voltage reverses, it is possible to carry out measurement of voltage using a single power source. This allows use of a differential amplifier, which can operate with a single power source, thereby resulting in a significant reduction in material cost of a detecting circuit. The apparatus, which alternately connects one of first and last signal lines of cells to the ground each time a polarity of a group of cells to be measured reverses, it may be possible to double the number of cells which can be scanned at a time in comparison with an apparatus without switching of the ground. As a result, the apparatus according to the present invention, which enables high-speed scanning of multi channels, is able to provide measurement of voltages of a group of cells, for example a fuel cell in which a large number of cells are connected to each other in series.

Although description has been given of the embodiment in which measurement of cell voltage is carried out while scanning is carried out for the cells of a fuel cell, the present invention is not limited to the fuel cell. It may be alternatively possible to apply the present invention not only to measurement of voltage of cells connected to each other in series in any type of secondary battery, but also to measurement of individual dry batteries connected to each other in series.

Because the apparatus for measuring voltage according to the present invention is able to detect electromotive forces of elements in a plurality of cells connected to each other in series, cells in a fuel cell for example, using smaller number of parts in comparison with a conventional apparatus, it may be possible to apply the apparatus according to the present invention to fields where monitoring of various types of batteries is required, especially an industrial field in which fuel cell systems are introduced.

Foreign priority documents, JP 2004-346959 filed on Nov. 30, 2004 and JP 2004-347874 filed on Nov. 30, 2004, are hereby incorporated by reference.

What is claimed is:

1. An apparatus for measuring a voltage of a cell while scanning a group of cells in a cell stack having a plurality of cells electrically connected in series, the apparatus comprising:
   a first switching device that is connected in series with a signal line carrying a voltage of a cell;
   a voltage detecting device for detecting the voltage of the cell, the voltage detecting device being electrically connected with signal lines that carry voltage of cells belonging to a group,
   wherein when the first switching device is electrically connected with an interface between two successive groups of cells, the first switching device is shared by the two groups; and
   a second switching device for selecting a line to be grounded from two signal lines which carry voltages of cells lying in interfaces on both sides of the group of cells,
   wherein the line to be grounded is alternately selected from two signal lines and grounded depending on whether an oddly or evenly numbered group is scanned,
   wherein the voltage detecting device detects the voltage of the cell when either of two lines is grounded,
   wherein the voltage detecting device comprises a differential amplifier, and
   wherein when the oddly numbered group is scanned, one of two signal lines which is a low voltage side in the oddly numbered group is selected to be grounded, and the differential amplifier adds a first offset voltage to an input voltage thereof, and when the evenly numbered group is scanned, one of two signal lines which is a high voltage side in the evenly numbered group is selected to be grounded, and the differential amplifier adds a second offset voltage higher than the first voltage to the input voltage thereof.

2. An apparatus according to claim 1, wherein an offset voltage is imposed on an input voltage of the voltage detecting device and the offset voltage is adjusted to be higher for a group of cells which is electrically connected with the voltage detecting device in such a manner that a relatively higher side of the group in terms of voltage is grounded.

3. An apparatus according to claim 1, wherein the first switching device is a PhotoMOS relay having a withstand voltage which is higher than a voltage of the cell stack.

4. An apparatus according to claim 1, wherein every time one of the two signal lines is grounded by switching provided by the second switching device, the voltage detecting device detects a voltage of a cell in a constant polarity.

5. An apparatus according to claim 1, wherein the two signal lines are alternately grounded, depending on the group of cells which is oddly or evenly numbered with respect to an initial group of cells, for which measurement is first carried out.

6. An apparatus according to claim 1, wherein the second switching device is a PhotoMOS relay having a withstand voltage which is higher than a voltage of the cell stack.

7. An apparatus according to claim 1, wherein the cell stack is a fuel cell stack.

8. An apparatus according to claim 1, wherein the second switching device is common to all cells.

* * * * *